(12) United States Patent
Feng

(10) Patent No.: US 10,656,825 B2
(45) Date of Patent: May 19, 2020

(54) DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xiaoliang Feng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/321,924

(22) PCT Filed: Sep. 12, 2018

(86) PCT No.: PCT/CN2018/105169
§ 371 (c)(1),
(2) Date: Jan. 30, 2019

(87) PCT Pub. No.: WO2020/034287
PCT Pub. Date: Feb. 20, 2020

(65) Prior Publication Data
US 2020/0050335 A1    Feb. 13, 2020

(30) Foreign Application Priority Data
Aug. 13, 2018    (CN) .......................... 2018 1 0918159

(51) Int. Cl.
*G06F 3/0488*    (2013.01)
*G06F 3/041*    (2006.01)
(Continued)

(52) U.S. Cl.
CPC .......... *G06F 3/0488* (2013.01); *G06F 3/0412* (2013.01); *G06F 3/0414* (2013.01);
(Continued)

(58) Field of Classification Search
CPC .... G06F 3/0488; G06F 3/0414; G06F 3/0412; H01L 51/5203; H01L 27/3276; H01L 51/5293; H01L 27/323
See application file for complete search history.

(56) References Cited

U.S. PATENT DOCUMENTS

2007/0242055 A1    10/2007    Lai
2015/0170575 A1*    6/2015    Kwak .................... G06F 3/047
345/174

(Continued)

FOREIGN PATENT DOCUMENTS

CN    103389824 A    11/2013
CN    104752466 A    7/2015
(Continued)

OTHER PUBLICATIONS

CN Office action and Search Report dated Nov. 22, 2019 as received in Application No. 201810918159.X.

*Primary Examiner* — Anthony Ho
(74) *Attorney, Agent, or Firm* — Maschoff Brennan (57) ABSTRACT

The present disclosure provides a display device including: an OLED display layer; and a touch layer and a pressure sensing layer disposed on the OLED display layer laminatedly, wherein the pressure sensing layer includes a plurality of first electrodes, the OLED display layer includes a cathode, and the plurality of electrodes are opposite to the cathode. The present disclosure integrates a pressure sensor in a display device, so that a multidimensional pressure sensing control may be achieved, and a customization may be implemented when needed.

20 Claims, 7 Drawing Sheets

(51) Int. Cl.
*H01L 27/32* (2006.01)
*H01L 51/52* (2006.01)

(52) U.S. Cl.
CPC ........ *H01L 27/323* (2013.01); *H01L 27/3276* (2013.01); *H01L 51/5203* (2013.01); *H01L 51/5293* (2013.01)

(56) References Cited

U.S. PATENT DOCUMENTS

| | | | |
|---|---|---|---|
| 2017/0308212 A1 | 10/2017 | Jin et al. | |
| 2018/0088718 A1 | 3/2018 | Liu et al. | |
| 2018/0095581 A1* | 4/2018 | Hwang | H01L 27/3244 |
| 2018/0095582 A1* | 4/2018 | Hwang | G06F 3/0412 |
| 2018/0277795 A1* | 9/2018 | Liu | H01L 51/5215 |

FOREIGN PATENT DOCUMENTS

| | | |
|---|---|---|
| CN | 204965385 U | 1/2016 |
| CN | 106406619 A | 2/2017 |
| CN | 106802742 A | 6/2017 |
| CN | 206258839 A | 6/2017 |
| CN | 107393942 A | 11/2017 |
| CN | 108052220 A | 5/2018 |

\* cited by examiner

DISPLAY DEVICE

TECHNICAL FIELD

The present disclosure belongs to a technical field of display, in particular, relates to a display device.

BACKGROUND ART

As a touch technology develops, although it needs to be attached to a display technology, the touch technology also affects user experience and simulation application of display products gradually. Particularly, the occurrence of a capacitive touch technology pushes the touch development to a new high degree. When people use the display products, except for simple touch gestures, new requirements are raised gradually, such as more motion recognitions, more convenient operation manners or the like, and thus a new type of touch manner "force touch" appears.

The force touch is applied to a display screen of a watch at first, the key point thereof is to manufacture a gravity sensing device at four angles of the watch, respectively, such that signal feedback may be performed in accordance with three dimensions of clicking, light-pressing and long-pressing, and thus the touch interactive experience is promoted to a force dimension from a time dimension, and the user experience feeling is increased. However, since this technology only has simple recognitions of three dimensions, and if this technology is applied to a large-sized mobile phone, there will be numerous difficulties, whereas as for the mobile phone even having a large-sized display with touch functions, the requirement for pressure sensing is never limited to simple controls of three dimensions, the requirement for pressure sensing promotion also becomes more and more urgent.

SUMMARY

In order to solve the problem existing in the prior art, a purpose of the present invention is to provide a display device that can implement a multidimensional pressure sensing control.

According to an aspect of the present disclosure, a display device is provided, which includes: an OLED display layer; and a touch layer and a pressure sensing layer disposed on the OLED display layer laminatedly, wherein the pressure sensing layer includes a plurality of first electrodes, the OLED display layer includes a cathode, and the plurality of first electrodes are opposite to the cathode.

Further, the pressure sensing layer further includes a plurality of second electrodes disposed on different layers from the plurality of first electrodes, and the first electrodes and the second electrodes correspond to each other one by one and are insulated from each other.

Further, the pressure sensing layer includes an insulating layer disposed between the plurality of first electrodes and the plurality of second electrodes.

Further, areas of the first electrodes are reduced gradually in a direction from an edge to a center of the pressure sensing layer.

Further, areas of the second electrodes are reduced gradually in a direction from an edge to a center of the pressure sensing layer.

Further, shapes of the first electrodes are polygons.

Further, shapes of the second electrodes are polygons.

Further, the display device further includes a substrate, a thin film transistor layer and a protection film layer, the thin film transistor layer and the OLED display layer are disposed on the substrate laminatedly in sequence, and the protection film layer is disposed on the touch layer or the pressure sensing layer laminatedly.

Further, the display device further includes a polarizer sheet, the polarizer sheet is disposed between the protection film layer and the touch layer, between the protection film layer and the pressure sensing layer, between the touch layer and the pressure sensing layer, between the OLED display layer and the touch layer, or between the OLED display layer and the pressure sensing layer.

Further, the first electrodes and/or the second electrodes are pressure sensing electrodes.

Advantageous effects of the present disclosure are as follows: the present disclosure integrates a pressure sensor in a display device, so that a multidimensional pressure sensing control may be achieved, and a customization may be implemented when needed.

BRIEF DESCRIPTION OF THE DRAWINGS

These and other aspects, characteristics and advantages of the embodiments in the present disclosure will become apparent from the following description, taken in conjunction with the accompanying drawings in which.

DETAILED DESCRIPTION OF EXEMPLARY EMBODIMENT

Embodiments of the present disclosure will be described in detail below by referring to the accompany drawings. However, the present disclosure may be implemented in numerous different forms, and the present disclosure should not be explained to be limited to specific embodiments set forth herein. Instead, these embodiments are provided for explaining the principle and actual application of the present disclosure, so that other skilled in the art can understand various embodiments of the present disclosure and various amendments which are suitable for specific intended applications.

In the drawings, like reference numerals indicate like elements throughout. It will be understood that, even though terms of "first", "second" etc. herein may be used to describe various elements, these elements should not be limited by these terms. The terms are only used to distinguish one element from another element.

It will be understood that, when an element such as a layer, a film, a region, a substrate or the like is referred to as being "on" another element, the element may be directly on the other element or intervening elements may be present as well. Optionally, when an element is referred to as being "directly on" another element, there are no intervening elements.

Figure 1:
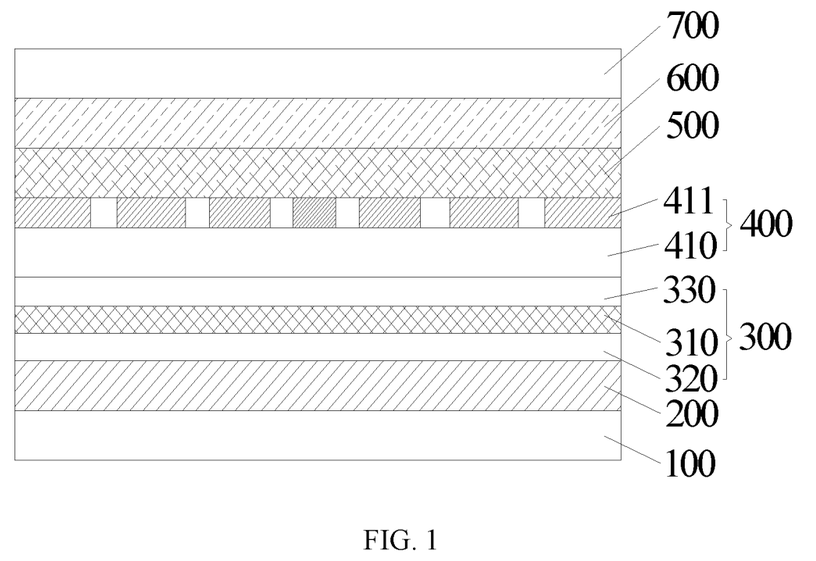
FIG. 1 is a schematic sectional view of a display device according to a first embodiment of the present disclosure.
Figure 2:
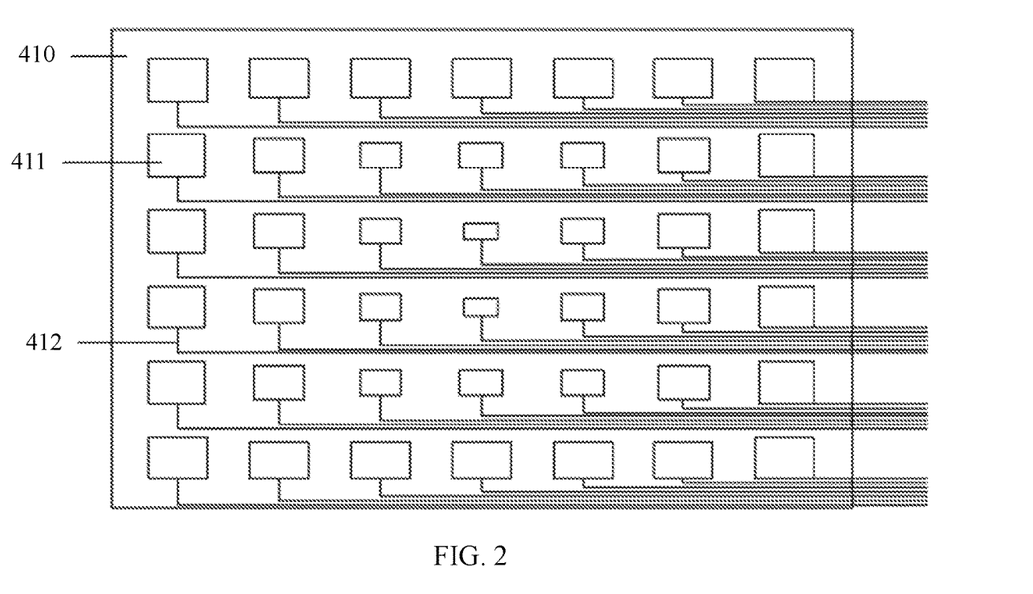
FIG. 2 is a schematic structure view of a first electrode and a first insulating layer according to a first embodiment of the present disclosure.
Figure 3:
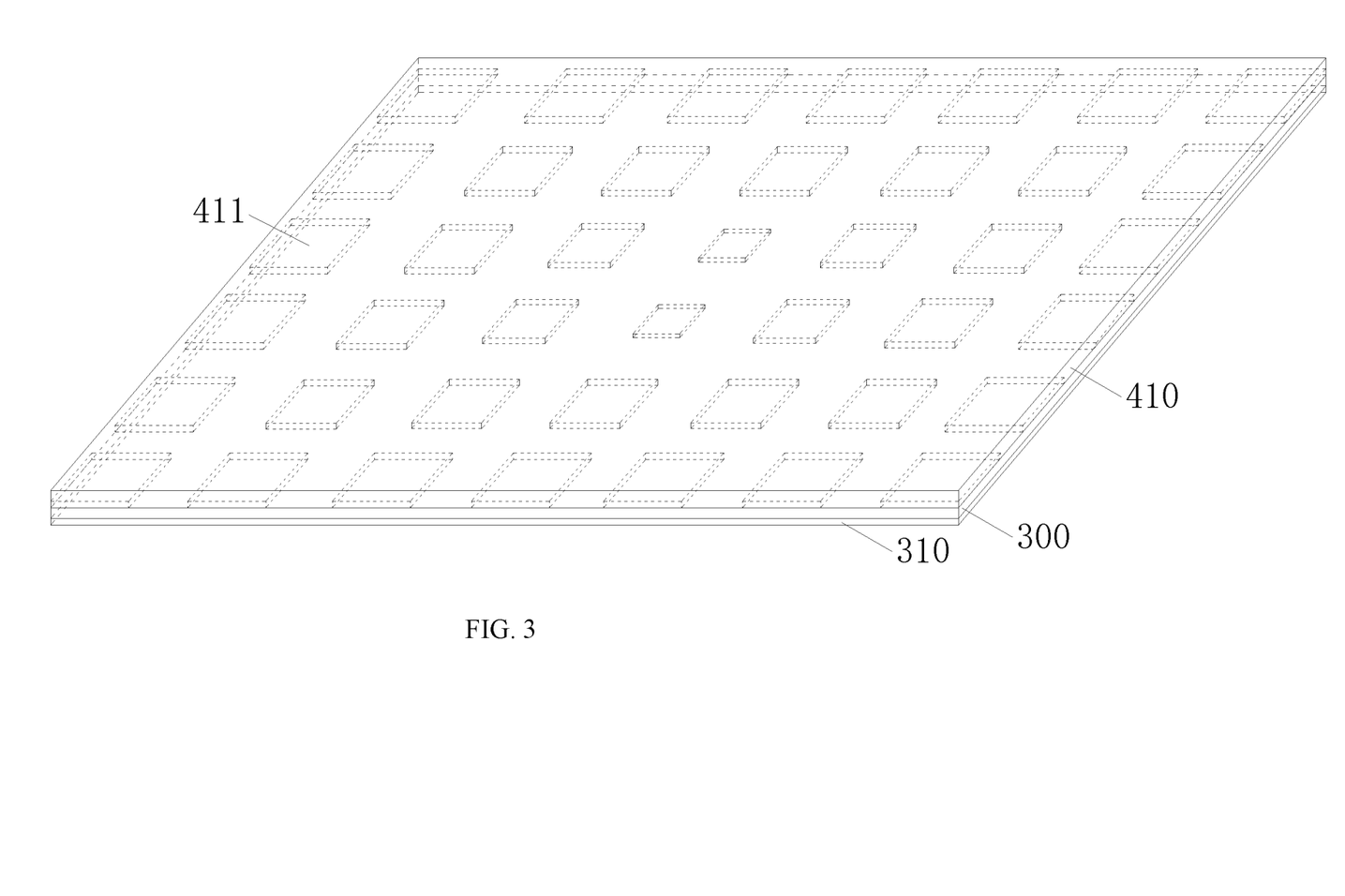
FIG. 3 is a schematic laminated three-dimensional view of a first electrode and a cathode according to a first embodiment of the present disclosure.

FIG. 1 is a schematic sectional view of a display device according to a first embodiment of the present disclosure. FIG. 2 is a schematic structure view of a first electrode and a first insulating layer according to a first embodiment of the present disclosure. FIG. 3 is a schematic laminated three-dimensional view of a first electrode and a cathode according to a first embodiment of the present disclosure.

Referring to FIG. 1, the display device according to a first embodiment of the present disclosure includes a substrate 100, a thin film transistor layer 200, an OLED display layer 300, a pressure sensing layer 400, a touch layer 500, a polarizer sheet 600 and a protection film layer 700.

The thin film transistor layer 200 is disposed on the substrate 100. In general, the thin film transistor layer 200 may include a plurality of thin film transistors arranged in an array. The OLED display layer 300 is disposed on the thin film transistor layer 200. In general, the OLED display layer 300 may include a plurality of OLED devices which constitute a light emitting layer 320 arranged in an array. Moreover, all OLED devices share a cathode 310, that is to say, cathodes of respective OLED devices are continuous to form a continuous cathode 310. In addition, the OLED display layer 300 may further include an encapsulating layer 330 located on the cathode 310 and an anode (not shown) located below the light emitting layer 320. It should be explained that a structure of the OLED display layer 300 of the present application is not limited hereto, which may have any existing proper structure.

The pressure sensing layer 400 is disposed on the OLED display layer 300, the touch layer 500 is disposed on the pressure sensing layer 400, the polarizer sheet 600 is disposed on the touch layer 500, and the protection film layer 700 is disposed on the polarizer sheet 600.

As another embodiment of the present disclosure, the polarizer sheet 600 may be disposed between the touch layer 500 and the pressure sensing layer 400, or the polarizer sheet 600 may be disposed between the pressure sensing layer 400 and the OLED display layer 300, meanwhile the protection film layer is disposed on the touch layer 500.

As yet embodiment of the present disclosure, the touch layer 500 may also is disposed on the OLED display layer 300, but the pressure sensing layer 400 is disposed on touch layer 500, the polarizer sheet 600 is disposed on the pressure sensing layer 400, and the protection film layer 700 is disposed on the polarizer sheet 600. Further, as yet embodiment of the present disclosure, the polarizer sheet 600 may be disposed between the touch layer 500 and the pressure sensing layer 400, or the polarizer sheet 600 may be disposed between the touch layer 500 and the OLED display layer 300, meanwhile the protection film layer is disposed on the pressure sensing layer 400.

Further, in conjunction with FIGS. 1 to 3, the pressure sensing layer 400 includes an insulating layer 410 and a plurality of first electrodes 411. The insulating layer 410 is disposed on the OLED display layer 300. After a position of the pressure sensing layer 400 is changed, a position of the insulating layer 410 is also changed therewith, for example, as mentioned above, after the pressure sensing layer 400 and the touch layer 500 exchange positions, the insulating layer 410 is disposed on the touch layer 500, and other changing manners are deduced by analogy.

The plurality of first electrodes 411 may be arranged on the first insulating layer 410 in an array. Here, as a preferable implementation, the plurality of first electrodes 411 are arranged in an array, but the present disclosure is not limited hereto, other proper arranging manners are also applied, such as a manner of being arranged in a concentric annulus or the like. The plurality of first electrodes 411 are opposite to the cathode 310 in the OLED display layer 300, to constitute a pressure-sensitive capacitance, thereby implementing the force touch in conjunction with the touch layer 500. Thus, the first electrodes 411 and the cathode 310 both are used as pressure sensing electrodes.

The first electrodes 411 are connected to a pressure sensing chip (not shown) in a bonding region through a first wire 412, and the received signals are processed and classified by the pressure sensing chip, so as to recognize a level of a pressure motion. It should be explained that, in FIG. 3, in order to clearly show spatial three-dimensional laminated states of the first electrodes 411 and the cathode 310, the first wire 412 is omitted.

Further, areas of the first electrodes 411 are reduced gradually in a direction from an edge to a center of the display device (or the pressure sensing layer 400). Thus, since areas of the first electrodes 411 are changed, capacitances generated between different first electrodes 411 and the cathode 310 differ after different first electrodes 411 are deformed, it is may be detected where the first electrode 411 is deformed, so that a pressed position may be detected.

Figure 7:
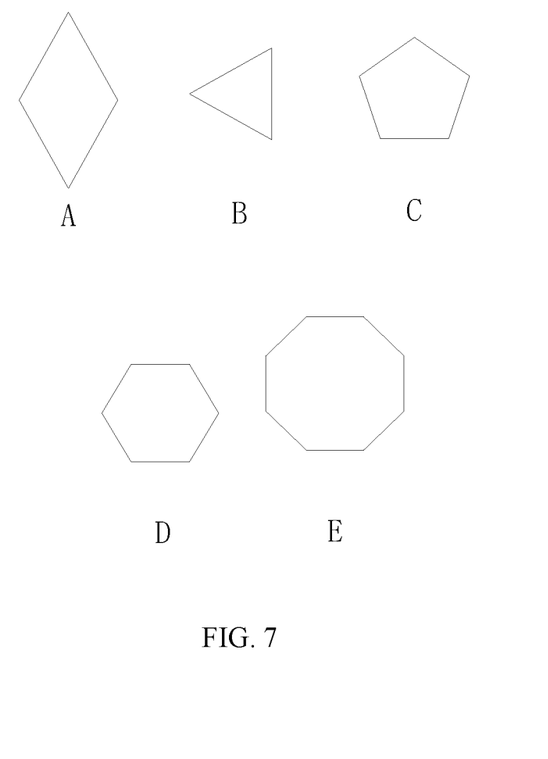
FIG. 7 is a schematic shape view of electrodes according to respective embodiments of the present disclosure.

In the present embodiment, the first electrodes 411 are in a rectangle, but the present disclosure is not limited hereto. For example, as shown in FIG. 7, the first electrodes 411 may also be in a diamond A, a triangle B, a regular pentagon C, a regular hexagon D, a regular octagon E or other proper regular or irregular shapes.

The first embodiment uses a principle of a capacitive pressure sensor, and uses the plurality of first electrodes 411 and the cathode 310 opposite to each other up and down to form flat capacitance, according to a flat capacitance equation $C=\varepsilon S/d$, wherein $\varepsilon$ is a dielectric constant of a dielectric medium between the first electrodes 411 and the cathode 310, S is an area of the first electrode 411, and d is a distance between the first electrode 411 and the cathode 310 before pressing. The first embodiment enables the first electrodes 411 to be bent and deformed through pressing, thereby changing the distance between the first electrode 411 and the cathode 310, and causing the capacitance to be changed, $\Delta C=\varepsilon S/d'-\varepsilon S/d$, wherein d' is a distance between the first electrode 411 and the cathode 310 after pressing. By capturing $\Delta C$ change signals, the signals are processed. A signal classifying process may be performed according to a magnitude of $\Delta C$ variation in a general case, and is fed back to a user interface in conjunction with a touch function, thereby forming a force touch function.

In addition, in the first embodiment, it may also use a client software to perform manufacturing, and a user defines classifying manners and motion categories of the pressure sensing according to their own requirements. Thus, the pressure sensing may implement functions together with the touch, and may also implement a pressure sensing control function independently.

In addition, the first electrodes 411 may be manufactured by using a print process, and may also be manufactured by using a photolithography process, but the present disclosure does not make specific definitions. Further, conductive materials used by the first electrodes 411 may be commonly used ITO, silver (Ag), aluminum (Al), etc., and may also other materials such as silver nanowire, graphene or the like.

It should be explained that, the pressure sensing layer 400 and the touch layer 500 may be manufactured independently to have a thin film structure, and then be adhered through adhesive materials such as OCA, OCR or the like; and the pressure sensing layer 400 and the touch layer 500 may also be manufactured together with the thin film transistor layer 200 and the OLED display layer 300, to form an Oncell structure.

Figure 4:
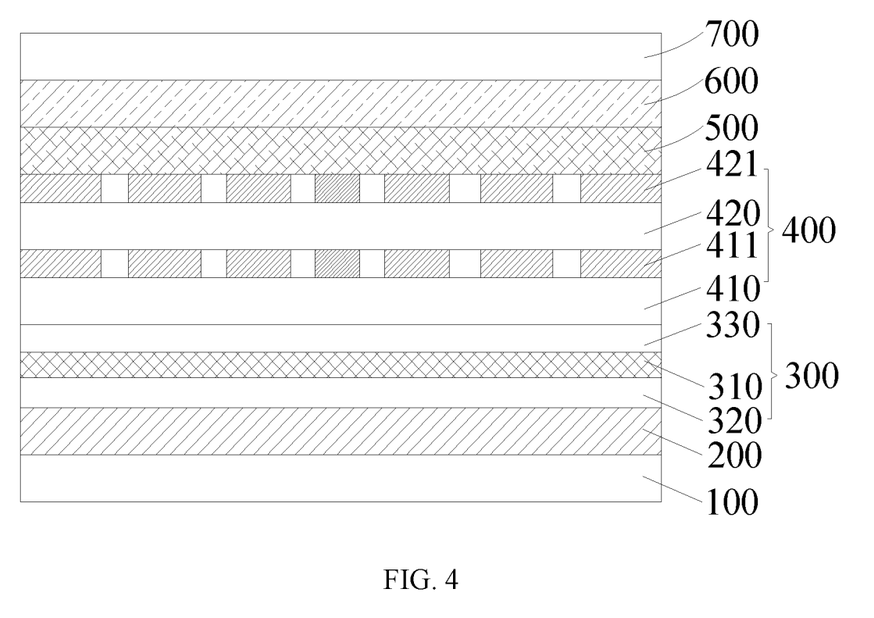
FIG. 4 is a schematic sectional view of a display device according to a second embodiment of the present disclosure.
Figure 5:
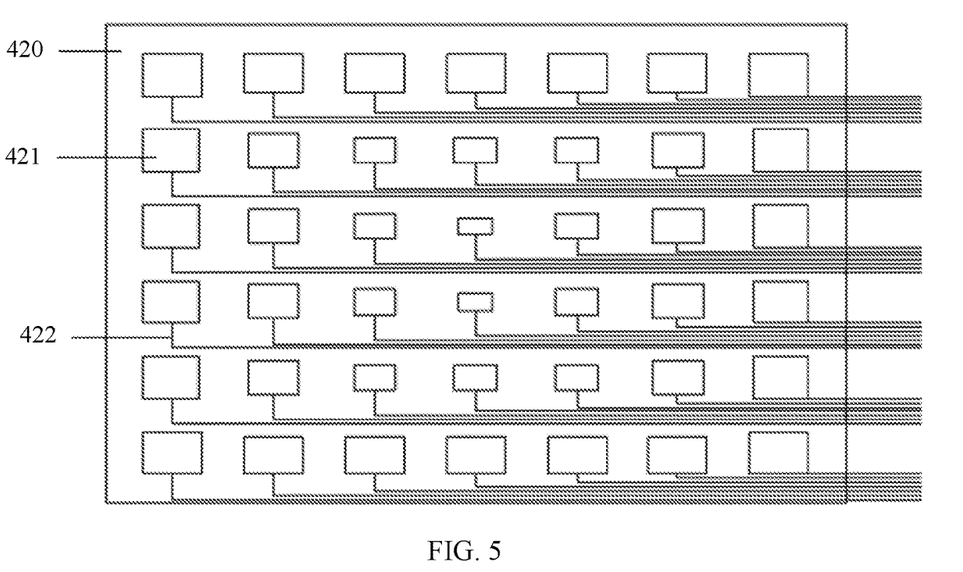
FIG. 5 is a schematic structure view of a second electrode and a second insulating layer according to a second embodiment of the present disclosure.
Figure 6:
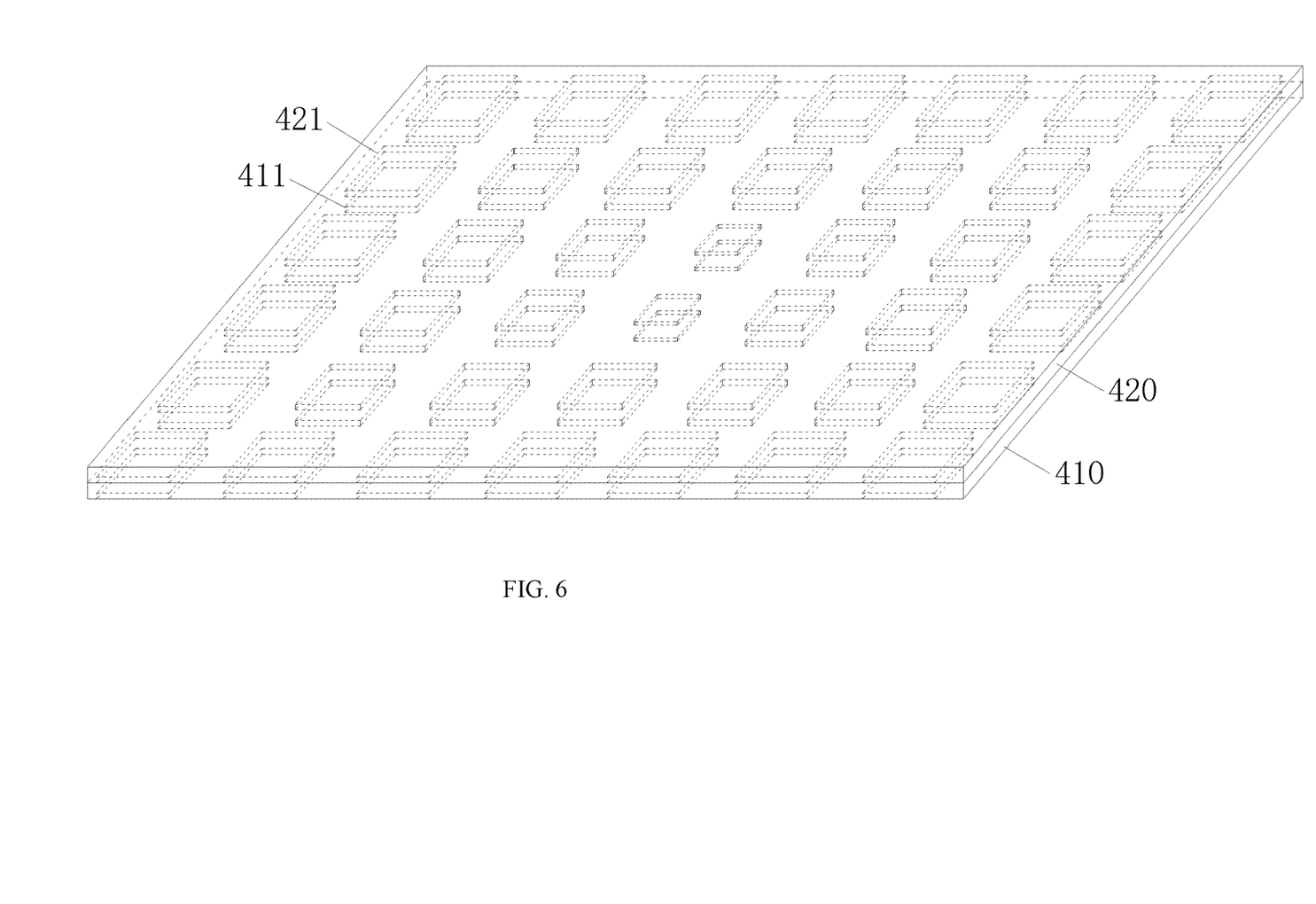
FIG. 6 is a schematic laminated three-dimensional view of a first electrode and a second electrode according to a second embodiment of the present disclosure.

FIG. 4 is a schematic sectional view of a display device according to a second embodiment of the present disclosure. FIG. 5 is a schematic structure view of a second electrode and a second insulating layer according to a second embodiment of the present disclosure. FIG. 6 is a schematic laminated three-dimensional view of a first electrode and a second electrode according to a second embodiment of the present disclosure.

Referring to FIGS. 4 to 6 together, the difference from the display device of the first embodiment shown in FIGS. 1 to 3 in that the pressure sensing layer 400 further includes a second insulating layer 420 and a plurality of second electrodes 421 in the second embodiment. The second insulating layer 420 is disposed on the plurality of electrodes 411, and the plurality of second electrodes 421 are arranged on the second insulating layer 420 in an array. Here, as a preferable implementation, the plurality of second electrodes 421 are arranged in an array, but the present disclosure is not limited hereto, other proper arranging manners are also applied, such as a manner of being arranged in a concentric annulus or the like.

There is pressure-sensitive capacitance between the plurality of second electrodes 421 and the plurality of first electrodes 411, thereby implementing the force touch in conjunction with the touch layer 500. Further, the first electrodes 411 and the second electrodes 421 are opposite to each other one by one (i.e., vertically opposite to each other one by one) and are insulated from each other, and thus the pressure-sensitive capacitance is formed between the first electrodes 411 and the second electrodes 421 that are opposite to each other. Thus, the first electrodes 411 and the second electrodes 421 both are used as pressure sensing electrodes.

The second electrodes 421 are connected to a pressure sensing chip in a bonding region through a second wire 422, the received signals are processed and classified by the pressure sensing chip, so as to recognize a level of a pressure motion. It should be explained that, in FIG. 6, in order to clearly show three-dimensional laminated states of the first electrodes 411 and the second electrodes 421, the first wire 412 and the second wire 422 are omitted.

Further, in consideration of the pressed deformation quantity of an edge of the display device being smaller than the pressed deformation quantity of a center thereof, in the present embodiment, areas of the first electrodes 411 and/or the second electrodes 421 are preferably reduced gradually in a direction from an edge to a center of the display device (or the pressure sensing layer 400), and thus the pressed capacitance variations of electrodes in respective regions may be processed uniformly.

Further, in the second embodiment, the first electrodes 411 and the second electrodes 421 that are opposite to each other are completely same. Moreover, in the second embodiment, the first electrodes 411 and the second electrodes 421 are in a rectangle, but the present disclosure is not limited hereto, for example, as shown in FIG. 7, the first electrodes 411 and the second electrodes 421 may also be in a diamond A, a triangle B, a regular pentagon C, a regular hexagon D, a regular octagon E or other proper regular or irregular shapes.

The second embodiment uses a principle of a capacitive pressure sensor, and uses the first electrodes 411 and the second electrodes 421 opposite to each other up and down to form flat capacitance, according to a flat capacitance equation $C=\varepsilon S/d$, wherein $\varepsilon$ is a dielectric constant of a dielectric medium between the first electrodes 411 and the second electrodes 421, S is an area of the first electrode 411 and the second electrode 421, and d is a distance between the first electrode 411 and the second electrode 421 before pressing. The second embodiment enables the electrodes to be bent and deformed through pressing, thereby changing the distance between the first electrode 411 and the second electrode 421, and causing the capacitance to be changed, $\Delta C=\varepsilon S/d'-\varepsilon S/d$, wherein d' is a distance between the first electrode 411 and the second electrode 421 after pressing. By capturing $\Delta C$ change signals, the signals are processed. A signal classifying process may be performed according to a magnitude of $\Delta C$ variation in a general case, and is fed back to a user interface in conjunction with a touch function, thereby forming a force touch function.

In addition, in the second embodiment, it may also use a client software to perform manufacturing, and a user defines classifying manners and motion categories of the pressure sensing according to their own requirements. Thus, the pressure sensing may implement functions together with the touch, and may also implement pressure sensing control function independently.

In addition, like the first electrodes 411, the second electrodes 421 may also be manufactured by using a print process, or may also be manufactured by using a photolithography process, but the present disclosure does not make specific definitions. Further, conductive materials that may also be used by the second electrodes 421 may be commonly used ITO, silver (Ag), aluminum (Al), etc., or may also other materials such as silver nanowire, graphene and the like.

In summary, according to the embodiments of the present disclosure, a pressure sensor is integrated in a display device, so that a multidimensional pressure sensing control may achieved, and a customization may be implemented when needed.

Although the present disclosure has been described with reference to the special embodiments, those skilled in the art will understand: various changes in form and details may be made therein without departing from the spirit and scope of the present disclosure as defined by the appended claims and its equivalents.

What is claimed is:

1. A display device, comprising:
    an OLED display layer; and
    a touch layer and a pressure sensing layer disposed on the OLED display layer laminatedly,
    wherein the pressure sensing layer comprises a plurality of first electrodes, the OLED display layer comprises a cathode, and the plurality of first electrodes are opposite to the cathode, and
    wherein areas of the plurality of first electrodes are reduced gradually in a direction from an edge to a center of the pressure sensing layer.

2. The display device of claim 1, wherein the pressure sensing layer further comprises a plurality of second electrodes disposed in different layers from the plurality of first electrodes, and each of the plurality of first electrodes and the plurality of second electrodes correspond to each other one by one and are insulated from each other.

3. The display device of claim 2, wherein the pressure sensing layer comprises an insulating layer disposed between the plurality of first electrodes and the plurality of second electrodes.

4. The display device of claim 3, wherein areas of the plurality of second electrodes are reduced gradually in a direction from an edge to a center of the pressure sensing layer.

5. The display device of claim 3, wherein a shape of the first electrode is a polygon.

6. The display device of claim 3, wherein a shape of the second electrode is a polygon.

7. The display device of claim 2, wherein areas of the plurality of second electrodes are reduced gradually in a direction from an edge to a center of the pressure sensing layer.

8. The display device of claim 2, wherein a shape of the first electrode is a polygon.

9. The display device of claim 2, wherein a shape of the second electrode is a polygon.

10. The display device of claim 2, wherein at least one of the plurality of first electrodes and the plurality of second electrodes are pressure sensing electrodes.

11. The display device of claim 1, wherein a shape of the first electrode is a polygon.

12. The display device of claim 1, wherein the display device further comprises a substrate, a thin film transistor layer and a protection film layer, the thin film transistor layer and the OLED display layer are disposed on the substrate laminatedly in sequence, and the protection film layer is disposed on the touch layer or the pressure sensing layer laminatedly.

13. The display device of claim 12, wherein the display device further comprises a polarizer sheet disposed:
between the protection film layer and the touch layer,
between the protection film layer and the pressure sensing layer,
between the touch layer and the pressure sensing layer,
between the OLED display layer and the touch layer, or
between the OLED display layer and the pressure sensing layer.

14. The display device of claim 1, wherein the plurality of first electrodes are pressure sensing electrodes.

15. A display device, comprising:
an OLED display layer; and
a touch layer and a pressure sensing layer disposed on the OLED display layer laminatedly,
wherein the pressure sensing layer comprises a plurality of first electrodes, the OLED display layer comprises a cathode, and the plurality of first electrodes are opposite to the cathode, and
wherein a shape of each of the plurality of first electrodes is a polygon.

16. The display device of claim 15, wherein the pressure sensing layer further comprises a plurality of second electrodes disposed in different layers from the plurality of first electrodes, and each of the plurality of first electrodes and the plurality of second electrodes correspond to each other one by one and are insulated from each other.

17. The display device of claim 16, wherein the pressure sensing layer comprises an insulating layer disposed between the plurality of first electrodes and the plurality of second electrodes.

18. The display device of claim 15, wherein areas of the plurality of first electrodes are reduced gradually in a direction from an edge to a center of the pressure sensing layer.

19. The display device of claim 15, wherein the display device further comprises a substrate, a thin film transistor layer and a protection film layer, the thin film transistor layer and the OLED display layer are disposed on the substrate laminatedly in sequence, and the protection film layer is disposed on the touch layer or the pressure sensing layer laminatedly.

20. The display device of claim 15, wherein the plurality of first electrodes are pressure sensing electrodes.

* * * * *